(12) United States Patent
Abe et al.

(10) Patent No.: US 9,591,763 B2
(45) Date of Patent: Mar. 7, 2017

(54) SUBSTRATE WITH EMBEDDED COMPONENT

(71) Applicant: FUJITSU LIMITED, Kawasaki-shi, Kanagawa (JP)

(72) Inventors: Mitsunori Abe, Kawasaki (JP); Kiyoyuki Hatanaka, Kawasaki (JP); Nobuo Taketomi, Kodaira (JP); Shigeo Iriguchi, Kawasaki (JP); Ryo Kanai, Kawasaki (JP); Naoki Nakamura, Hachioji (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/068,706

(22) Filed: Mar. 14, 2016

(65) Prior Publication Data

US 2016/0324005 A1 Nov. 3, 2016

(30) Foreign Application Priority Data

Apr. 28, 2015 (JP) ................... 2015-091189

(51) Int. Cl.
| | |
|---|---|
| *H05K 1/16* | (2006.01) |
| *H05K 1/11* | (2006.01) |
| *H05K 1/18* | (2006.01) |
| *H05K 1/09* | (2006.01) |
| *H05K 1/03* | (2006.01) |
| *H05K 3/46* | (2006.01) |
| *H05K 1/02* | (2006.01) |
| *H05K 3/00* | (2006.01) |

(52) U.S. Cl.
CPC ........... *H05K 1/185* (2013.01); *H05K 1/0298* (2013.01); *H05K 1/0366* (2013.01); *H05K 1/09* (2013.01); *H05K 1/111* (2013.01); *H05K 1/115* (2013.01); *H05K 3/0047* (2013.01); *H05K 3/4644* (2013.01); *H05K 2201/0959* (2013.01)

(58) Field of Classification Search
CPC ........ H05K 1/185; H05K 1/111; H05K 1/115; H05K 3/0047; H05K 3/4644; H05K 2201/0959; H05K 1/0298
USPC .................. 174/260, 262–266; 361/761
See application file for complete search history.

(56) References Cited

U.S. PATENT DOCUMENTS

| | | | | |
|---|---|---|---|---|
| 4,185,378 A | * | 1/1980 | Machida ............... | H05K 3/326 174/263 |
| 4,301,189 A | * | 11/1981 | Arai ..................... | H05K 3/0079 101/127 |
| 4,806,706 A | | 2/1989 | Machida et al. | |
| 5,266,748 A | * | 11/1993 | Kawakami ........... | H05K 1/0218 174/260 |
| 5,590,462 A | * | 1/1997 | Hundt ................. | H01L 23/3677 174/523 |

(Continued)

FOREIGN PATENT DOCUMENTS

| | | |
|---|---|---|
| GB | 2289170 | 11/1995 |
| JP | 63-250893 | 10/1988 |
| JP | 07-302970 | 11/1995 |

*Primary Examiner* — Sherman Ng
(74) *Attorney, Agent, or Firm* — Fujitsu Limited Center

(57) ABSTRACT

Disclosed substrate with embedded component includes: an insulating base member; a conductive pad formed on the insulating base member; a component connected to the conductive pad with a solder; and a resin covering the component, wherein a hole is provided in the insulating base member and the conductive pad, and the insulating base member is exposed on a side surface of the hole.

9 Claims, 16 Drawing Sheets

(56) References Cited

U.S. PATENT DOCUMENTS 5,767,446 A * 6/1998 Ha ................. H01L 23/13
                                                                     174/260
2004/0262033 A1 * 12/2004 Chiu ................ H05K 3/284
                                                                     174/256

* cited by examiner

FIG.7

| the size of the component 3 (Y×Z) | 0.6mm×0.3mm | 1.0mm×0.5mm | 1.6mm×0.8mm | 2.0mm×1.2mm |
|---|---|---|---|---|
| (1) the thermal expansion amount $\Delta V_s$ (mm$^3$) of the solder 4 | $5.7 \times 10^{-5}$ | $1.3 \times 10^{-4}$ | $2.5 \times 10^{-4}$ | $5.3 \times 10^{-4}$ |
| (2) the thermal expansion amount $\Delta V_r$ (mm$^3$) of the resin 11 | $1.7 \times 10^{-4}$ | $3.8 \times 10^{-4}$ | $7.6 \times 10^{-4}$ | $1.6 \times 10^{-3}$ |
| (3) the amount $\Delta V_h$ (mm$^3$) of the solder 4 entering the hole 1a | $2.3 \times 10^{-4}$ | $5.0 \times 10^{-4}$ | $1.0 \times 10^{-3}$ | $2.1 \times 10^{-3}$ |
| (4) the area $S_c$ of the conductive pad 2 | 0.09 | 0.2 | 0.4 | 0.84 |

FIG.8

| the size of the component 3 (Y×Z) | 0.6mm×0.3mm | 1.0mm×0.5mm | 1.6mm×0.8mm | 2.0mm×1.2mm |
|---|---|---|---|---|
| the diameter D (mm) of the hole 1a | 0.07 | 0.11 | 0.15 | 0.22 |
| the area $S_h$ (mm$^2$) of the hole 1a | $3.8 \times 10^{-3}$ | $9.4 \times 10^{-3}$ | $1.8 \times 10^{-2}$ | $3.8 \times 10^{-2}$ |
| the volume V (mm$^3$) of the hole 1a | $2.3 \times 10^{-4}$ | $5.6 \times 10^{-4}$ | $1.1 \times 10^{-3}$ | $2.3 \times 10^{-3}$ |

SUBSTRATE WITH EMBEDDED COMPONENT

CROSS-REFERENCE TO RELATED APPLICATION(s)

This application is based upon and claims the benefit of priority of the prior Japanese Patent Application No. 2015-091189, filed on Apr. 28, 2015, the entire contents of which are incorporated herein by reference.

FIELD

The embodiments discussed herein are related to a substrate with embedded component.

BACKGROUND

Electronic devices such as a personal computer and a server incorporate various kinds of wiring substrates.

Among them, the substrate with embedded component such as a resistive element or a capacitor can have a small outer shape, because the component is not exposed on the surface of the substrate, thereby leading to downsizing of an electronic device.

Note that technologies related to the present application are disclosed in Japanese Laid-open Patent Publication No. 07-302970 and Japanese Examined Laid-open Patent Publication No. Hei 6-9302.

SUMMARY

According to one aspect discussed herein, there is provided a substrate with embedded component including: an insulating base member; a conductive pad formed on the insulating base member; a component connected to the conductive pad with a solder; and a resin covering the component, wherein a hole is provided in the insulating base member and the conductive pad, and the insulating base member is exposed on a side surface of the hole.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 7 is a table obtained by calculating the thermal expansion amounts of solder and resin for electronic components having different sizes in the first embodiment;

FIG. 8 is a table obtained by calculating the diameter of the hole which is suitable to the size of each electronic component, the area of the hole in a plan view, and the volume of the hole in the first embodiment.

DESCRIPTION OF EMBODIMENTS

Prior to the description of the embodiments, matters investigated by the inventors are described.

FIGS. 1A to 1E are cross-sectional views of a substrate with embedded component in the course of manufacturing thereof, which was used in the investigation.

Figure 1A:
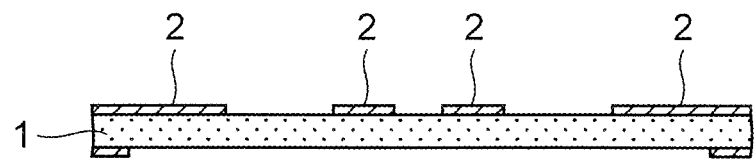
FIGS. 1A to 1E are cross-sectional views of a substrate with embedded component in the course of manufacturing thereof, which is used in the investigation.

As illustrated in FIG. 1A, in order to manufacture the substrate with embedded component, a copper-clad base member that is made by forming copper film on both surface of an insulating base member 1 is prepared. Then, the copper film is patterned into conductive pad 2. The insulating base member 1 is, for example, a glass epoxy substrate.

Figure 1B:
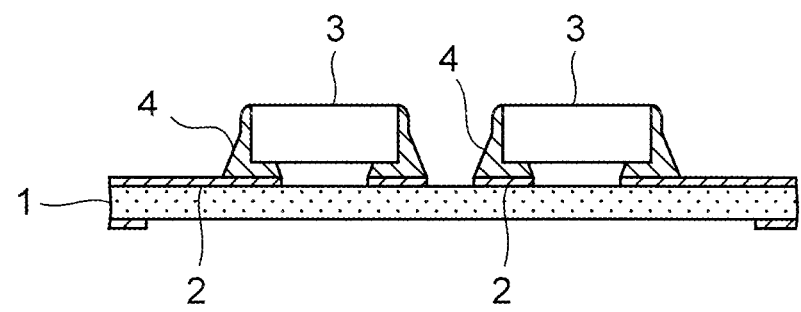

Subsequently, as illustrated in FIG. 1B, solder paste as solder 4 is printed on the conductive pad 2, and a component 3 is mounted on the solder 4. Thereafter, the solder 4 is heated to be melted, thereby connecting the component 3 to the conductive pad 2 with the solder 4.

The component 3 may be, for example, a resistive element, a capacitor, or a coil.

The material of the solder 4 is preferably a lead-free solder, which is eco-friendly, and a SnAgCu solder is used in this example. The melting point of the SnAgCu solder depends on its composition ratio. For example, a Sn-3Ag-0.5Cu solder having a melting point of about 220° C. is used as the material of the solder 4.

Note that, the conductive pad 2, to which the component 3 is connected as described above, is also called as a foot print.

Figure 1C:
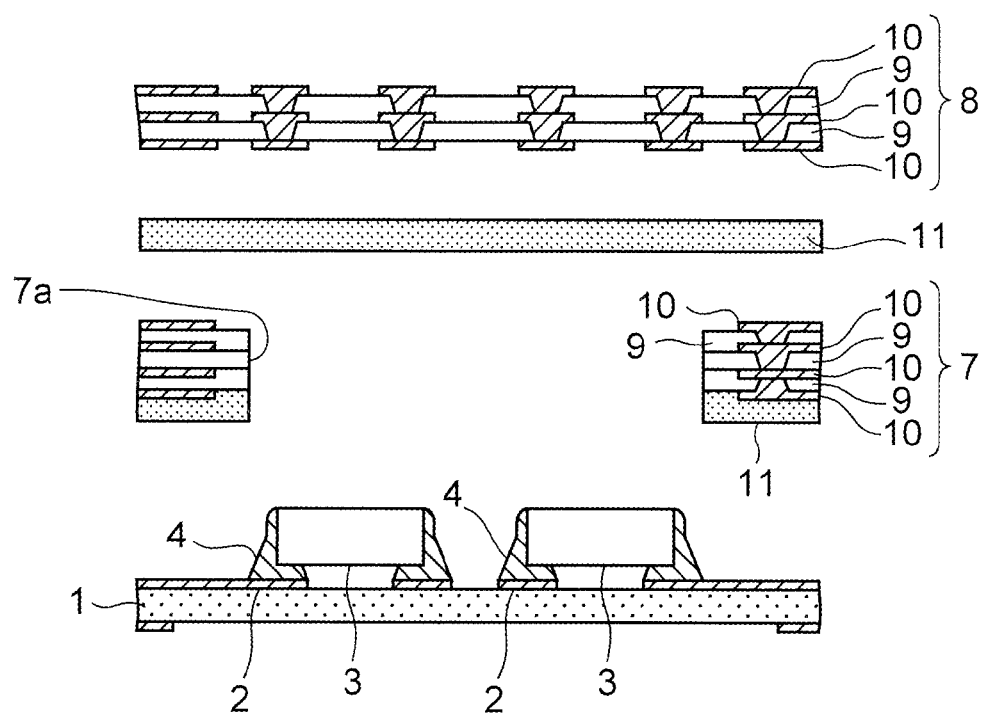

Next, a process illustrated in FIG. 1C is described.

Firstly, a first multi-layer wiring base member 7 and a second multi-layer wiring base member 8 are disposed over the insulating base member 1, to which the component 3 is connected as described above.

The multi-layer wiring base members 7 and 8 each include alternate layers of an insulating layer 9 and wiring 10. A resin sheet of epoxy resin may be used as the insulating layer 9. Then, a copper-plated layer may be formed as the wiring 10.

Then, prepreg as thermosetting resin 11 is adhered onto a surface of the first multi-layer wiring base member 7. In addition, an opening 7a having a dimension enough to house the component 3 is formed in the resin 11 and the first multi-layer wiring base member 7 by mechanical processing.

The resin 11 is, for example, a thermosetting epoxy resin, and is disposed also between the first multi-layer wiring base members 7 and 8. Note that the resin 11 is not yet cured at this step and is in an uncured state.

Figure 1D:
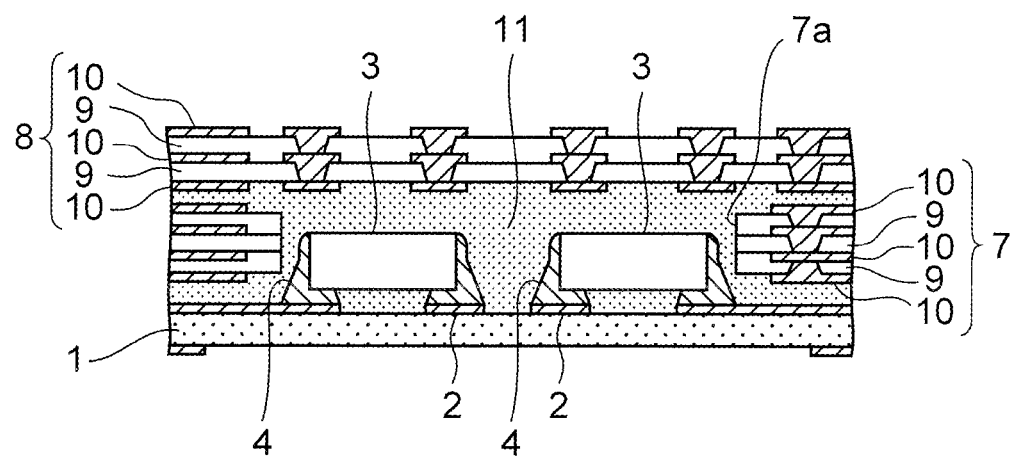

Subsequently, as illustrated in FIG. 1D, the insulating base member 1, the first multi-layer wiring base member 7, the second multi-layer wiring base member 8, and the resin 11 are stacked and pressed while heating these elements, thereby thermally curing the resin 11.

The highest temperature of the resin 11 in this process is in a range of about 180° C. to 200° C. at which the resin 11 is thermally cured. Since this temperature is lower than the melting point of the solder 4, the solder 4 is not melted in this process.

By pressing in this manner, the resin 11 penetrates into the opening 7a, and the opening 7a is filled with the resin 11.

Figure 1E:
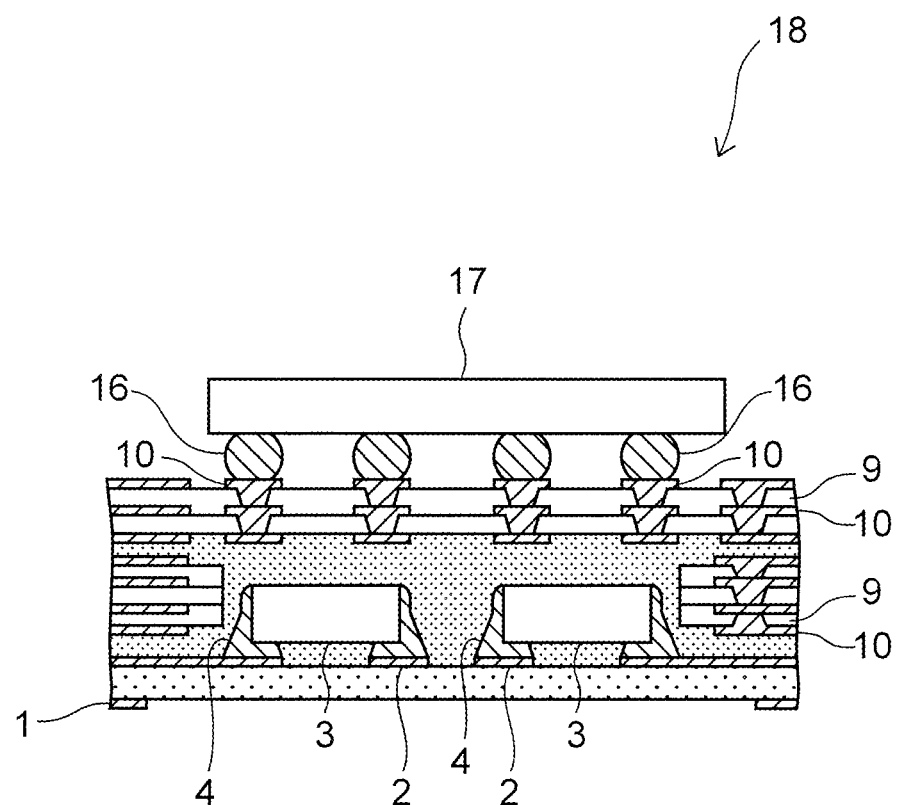

Subsequently, as illustrated in FIG. 1E, a semiconductor element 17 is mounted on the uppermost wiring 10 via a solder bump 16. In this example, the solder bump 16 is a Sn-3Ag-0.5Cu solder having the same composition ratio and melting point as those of the solder 4.

Then, the solder bump 16 is subjected to reflow by heating it, thereby connecting the semiconductor element 17 to the wiring 10 with the solder bump 16.

Thus, the basic structure of the substrate 18 with embedded component according to this example is completed.

The substrate 18 can have a small outer shape because the component 3 is not exposed on the substrate surface, thereby leading to downsizing of an electronic device such as a server in which the substrate 18 is incorporated.

Here, according to the method of manufacturing the substrate 18 with the embedded component, the solder 4 and the resin 11 are also heated by heat for melting the solder bump 16 in the process of FIG. 1E.

Figure 2:
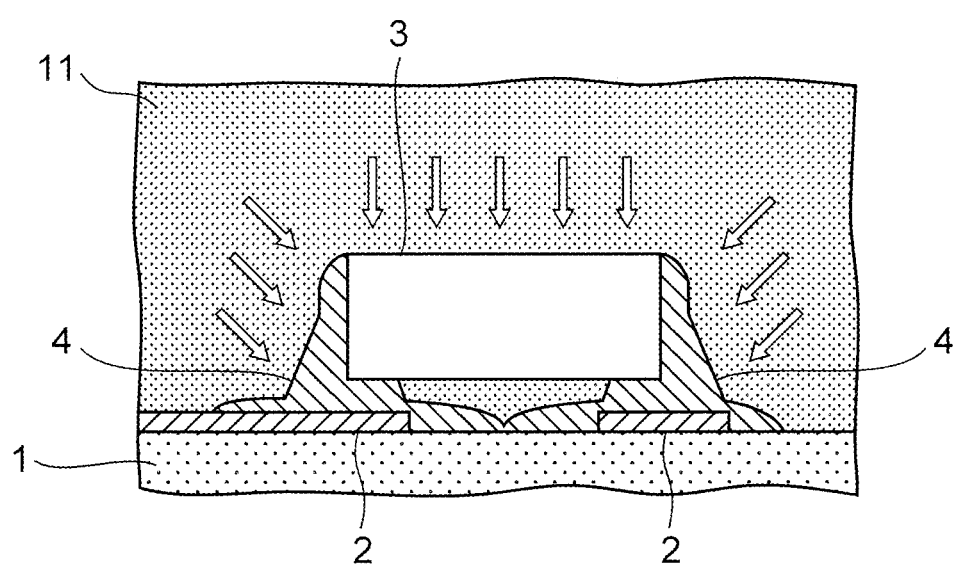
FIG. 2 is an enlarged cross-sectional view schematically illustrating a component and its surroundings.

FIG. 2 is an enlarged cross-sectional view schematically illustrating the surroundings of the component 3 at this time.

Since the solder bump 16 and the solder 4 have the same melting point as described above, the solder 4 is also melted when the solder bump 16 is melted by heating. In addition, the resin 11 around the solder 4 thermally expands by this heat.

Accordingly, the melted solder 4 is pressurized by the resin 11 around the solder 4 and spreads along an interface between the resin 11 and the insulating base member 1 in the lateral direction. Then, in the worst case, the conductive pads 2 adjacent to each other in the lateral direction are electrically short-circuited via the solder 4.

Such a phenomenon is called solder flash, which adversely contributes to the reduction in the yield of the substrate 18 with embedded component.

Although the inventors investigated some methods for preventing the solder flash, these methods have difficulties.

For example, it is considered that the material having higher melting point than that of the Sn-3Ag-0.5Cu solder, which is the material of the solder bump 16, is employed as the material of the solder 4. In this case, the solder 4 having the higher melting point does not melt even when subjected to the reflow in the process of FIG. 1E, thereby preventing the above described solder flash.

In this method, however, the solder 4 needs to be heated at high temperature to be melted in the process of FIG. 1B, which causes a significant difference in the thermal expansion between the insulating base member 1 and the conductive pad 2 due to the heating, so that damage such as crack occurs to the insulating base member 1.

In contrast, it is also considered that the solder having lower melting point than that of the Sn-3Ag-0.5Cu solder, which is the material of the solder 4, is employed as the material of the solder bump 16, for the purpose of preventing the solder 4 from melting when the solder bump 16 is subjected to the reflow. However, the solder having lower melting point than that of the Sn-3Ag-0.5Cu solder is mechanically fragile. Therefore, when such a solder is used as the solder bump 16, connection strength between the wiring 10 and the semiconductor element 17 is lowered.

Alternatively, the material, whose melting point rises once melted, is considered to be used for the solder 4.

For example, in the solder paste in which copper powder is added to the solder, since a part of the copper powder is melted into the solder at the first melting, composition ratio of copper in the solder becomes high. Thus, a higher temperature than that in the first melting is required to melt the solder at the next melting, and thus the solder 4 is considered to be not melted in the reflow of the solder bump 16 in the process illustrated in FIG. 1E.

However, since a rise in the melting point of the solder 4 is small, the solder 4 is potentially melted in the reflow of the solder bump 16 in the process illustrated in FIG. 1E, which causes the aforementioned solder flash.

Instead of changing the material of the solder 4 in this manner, it is considered that the opening 7a may be filled with an adhesive agent before the process of FIG. 1D, and the adhesive agent is cured in advance. Thus, the surroundings of the solder 4 are harden with the adhesive agent, which prevents the solder 4 from spreading in the lateral direction even when the solder 4 is melted in the process illustrated in FIG. 1E.

However, this method requires an additional process of filling the adhesive agent into the opening 7a, resulting in an increase in the number of processes and also in manufacturing cost of the substrate 18. Moreover, it is technologically difficult to measure the adhesive agent having the same volume as that of the opening 7a and fill this adhesive agent into the opening 7a.

In the followings, embodiments capable of preventing the solder flash are described.

First Embodiment

In the present embodiment, the solder flash in a substrate with embedded component is prevented as described below.

FIGS. 3A to 3G are cross-sectional views of a substrate with embedded component in the course of manufacturing thereof according to the present embodiment. FIGS. 4A and 4B are enlarged plan views of the substrate with embedded component in the course of manufacturing thereof according to the present embodiment.

Note that in FIGS. 3A to 3G and 4A to 4B, the same element as that illustrated in FIGS. 1A to 1E and 2 is denoted by the same reference numeral as that in FIGS. 1A to 1E and 2, and description thereof is omitted in the following.

Figure 3A:
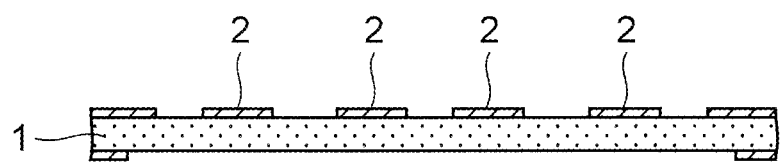
FIGS. 3A to 3G are cross-sectional views of a substrate with embedded component in the course of manufacturing thereof according to a first embodiment.
Figure 4A:
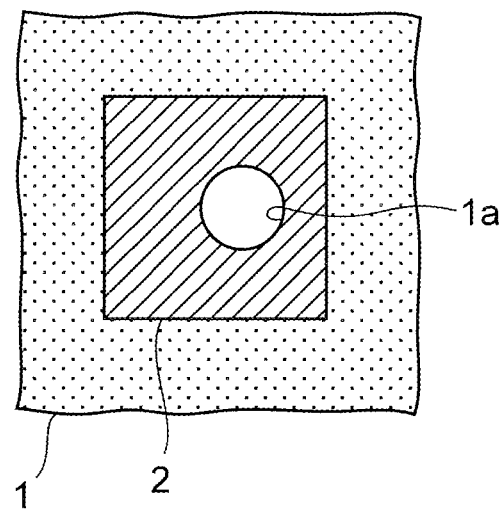
FIGS. 4A and 4B are enlarged plan views of the substrate with embedded component in the course of manufacturing thereof according to the first embodiment.
Figure 4B:
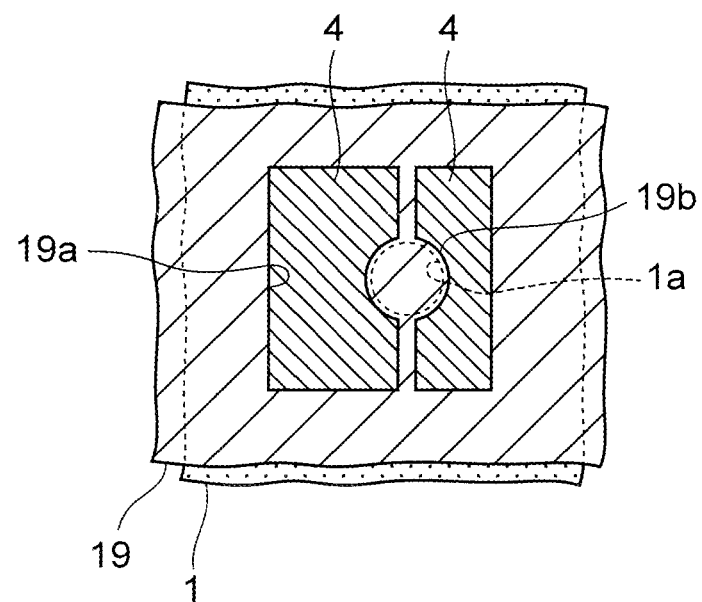

First, as illustrated in FIG. 3A, a copper-clad base member, which is made by forming copper films having a thickness of about 12 μm to 35 μm on both surfaces of the insulating base member 1, is prepared. After that, the copper films are patterned into conductive pads 2.

The material and thickness of the insulating base member 1 are not particularly limited. In this example, a glass epoxy substrate having a thickness of about 0.06 mm to 0.2 mm is used as the insulating base member 1.

Figure 3B:
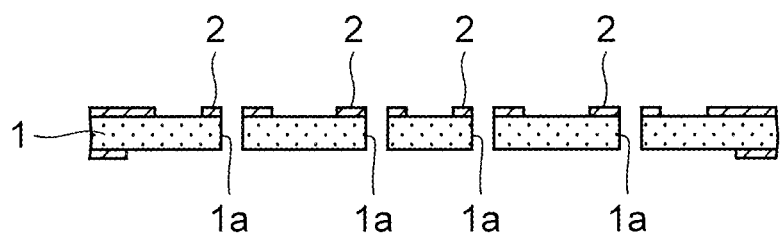

Next, as illustrated in FIG. 3B, a hole 1a is formed in each of the conductive pad 2 and the insulating base member 1 by drilling.

Note that the holes 1a may be formed by laser processing instead of drilling. In this case, a portion of the conductive pad 2 corresponding to the holes 1a may be previously removed in the patterning of FIG. 3A to allow the holes 1a to be formed only in the insulating base member 1 by laser processing.

In the present embodiment, metal film and the like is not formed on the side surface of the hole 1a, so that the material of the insulating base member 1 is left exposed in the hole 1a.

FIG. 4A is an enlarged plan view of the hole 1a and its surrounding when this process is ended.

As illustrated in FIG. 4A, the hole 1a has an approximately circular plane shape, and the all portions of the hole 1a is included in the conductive pad 2 in a plan view.

Figure 3C:
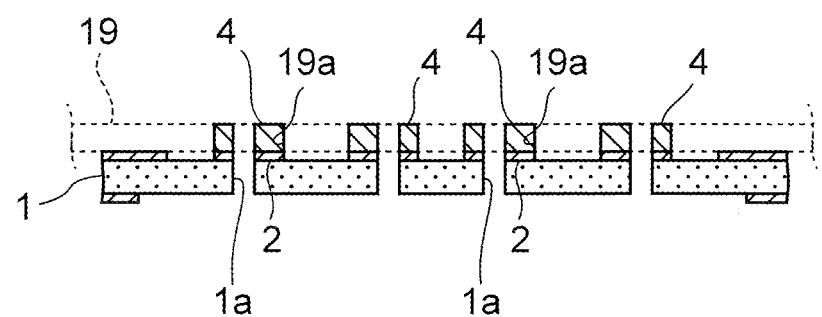

Next, as illustrated in FIG. 3C, a metal mask 19 is disposed over the insulating base member 1.

An opening 19a is formed at a position of the metal mask 19 that corresponds to the conductive pad 2, and the position of the metal mask 19 is adjusted so that the opening 19a overlaps the conductive pad 2.

Then, by a printing method, solder paste is printed as the solder 4 on the conductive pad 2 in the opening 19a.

The solder 4 is preferably a lead-free solder, which is eco-friendly, and is a SnAgCu solder in this example. The melting point of this SnAgCu solder is also not particularly limited. In the present embodiment, Sn-3Ag-0.5Cu, which has a low melting point of about 220° C. and thus causes no damage on the insulating base member 1 when melted, is used.

FIG. 4B is an enlarged plan view of the hole 1a and its surrounding when this process is ended.

As illustrated in FIG. 4B, an island 19b is provided to the metal mask 19, and the hole 1a is closed by the island 19b. Thus, the solder 4 can be printed only around the hole 1a, while preventing the solder 4 from entering into the hole 1a.

Figure 3D:
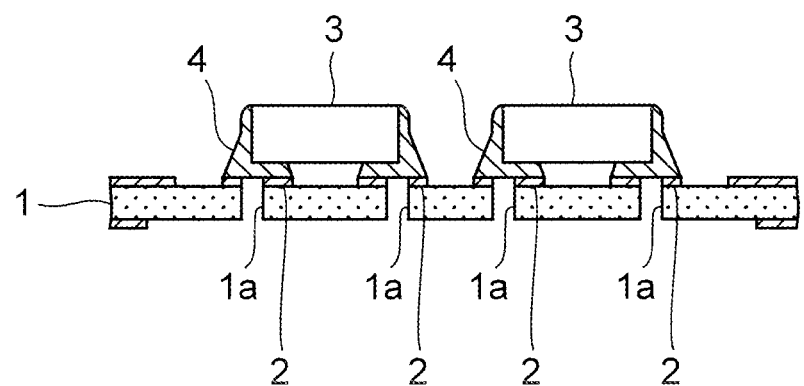

Subsequently, as illustrated in FIG. 3D, the component 3 is mounted on the solder 4. Then, the solder 4 is melted by heating it at a temperature of about 220° C., thereby connecting the component 3 to the conductive pad 2 with the solder 4. The component 3 may be, for example, a resistive element, a capacitor, or a coil.

Even when the solder 4 is melted in this manner, the solder 4 hardly enters into the hole 1a, because the insulating material of the insulating base member 1 having a low solder wettability is exposed on the side surface of the hole 1a.

Figure 3E:
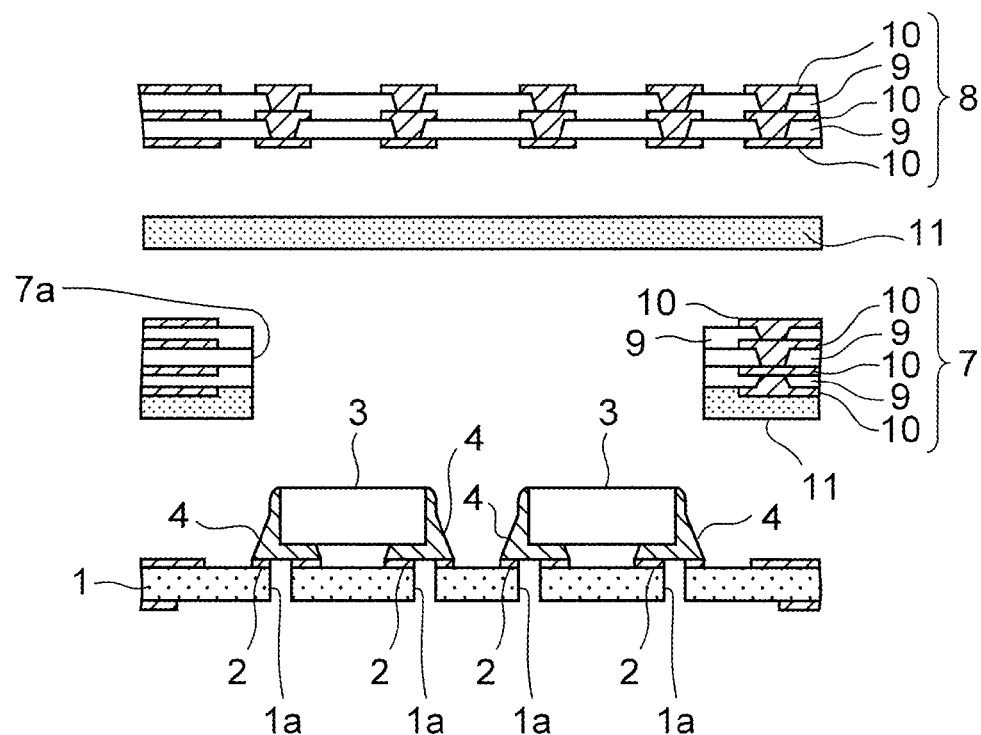

Subsequently, as illustrated in FIG. 3E, the first multi-layer wiring base member 7, the resin 11, and the second multi-layer wiring base member 8 explained in FIG. 1C are disposed in this order over the insulating base member 1.

As explained in FIG. 1C, prepreg is adhered as the resin 11 onto the surface of the first multi-layer wiring base member 7. Also, the opening 7a having a size enough to house the component 3 therein is formed in the resin 11 and the first multi-layer wiring base member 7.

Prepreg used as the resin 11 is, for example, a thermosetting epoxy resin, and is in the uncured state at this time. Although the thickness of the resin 11 is not particularly limited, the thickness of the resin 11 is about 0.06 mm to 0.2 mm in this example.

In addition, the thicknesses of the insulating layer 9 and the wiring 10 are not particularly limited. The insulating layer 9 is, for example, a resin sheet of epoxy resin having a thickness of about 0.06 mm to 0.2 mm. The wiring 10 is, for example, a copper-plated layer having a thickness of about 12 µm to 35 µm.

Figure 3F:
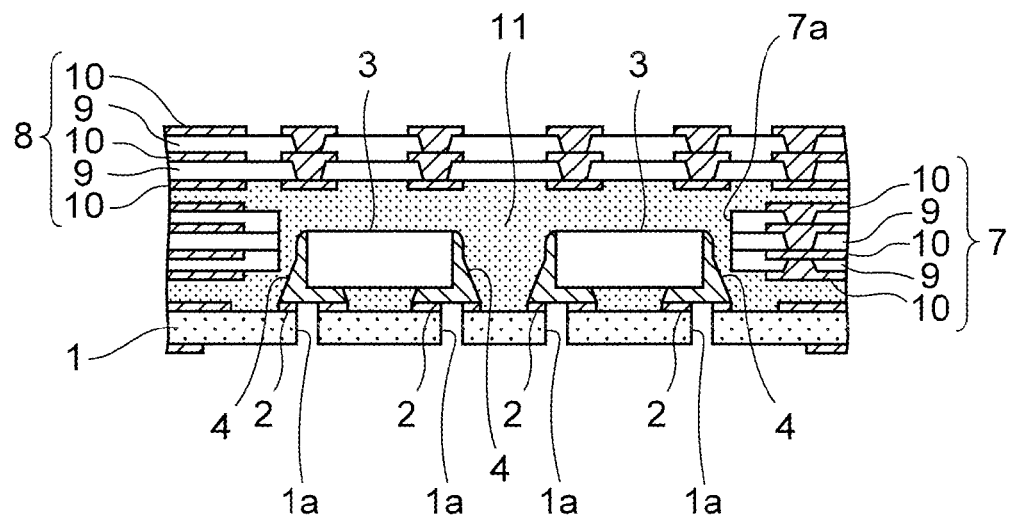

Then, as illustrated in FIG. 3F, the insulating base member 1, the first multi-layer wiring base member 7, the resin 11, and the second multi-layer wiring base member 8 are stacked. Thus, the opening 7a is closed by the second multi-layer wiring base member 8, while housing the component 3 in the opening 7a.

Thereafter, the insulating base member 1, the first multi-layer wiring base member 7, the resin 11, and the second multi-layer wiring base member 8 are pressed while heating these elements, thereby thermally curing the resin 11.

The highest temperature of the resin 11 in this process is in the range of about 180° C. to 200° C. at which the resin 11 is thermally cured. Since this temperature is lower than the melting point of the solder 4, the solder 4 is not melted in this process.

Moreover, by pressing in this manner, the resin 11 penetrates into the opening 7a, and the opening 7a is filled with the resin 11.

Figure 3G:
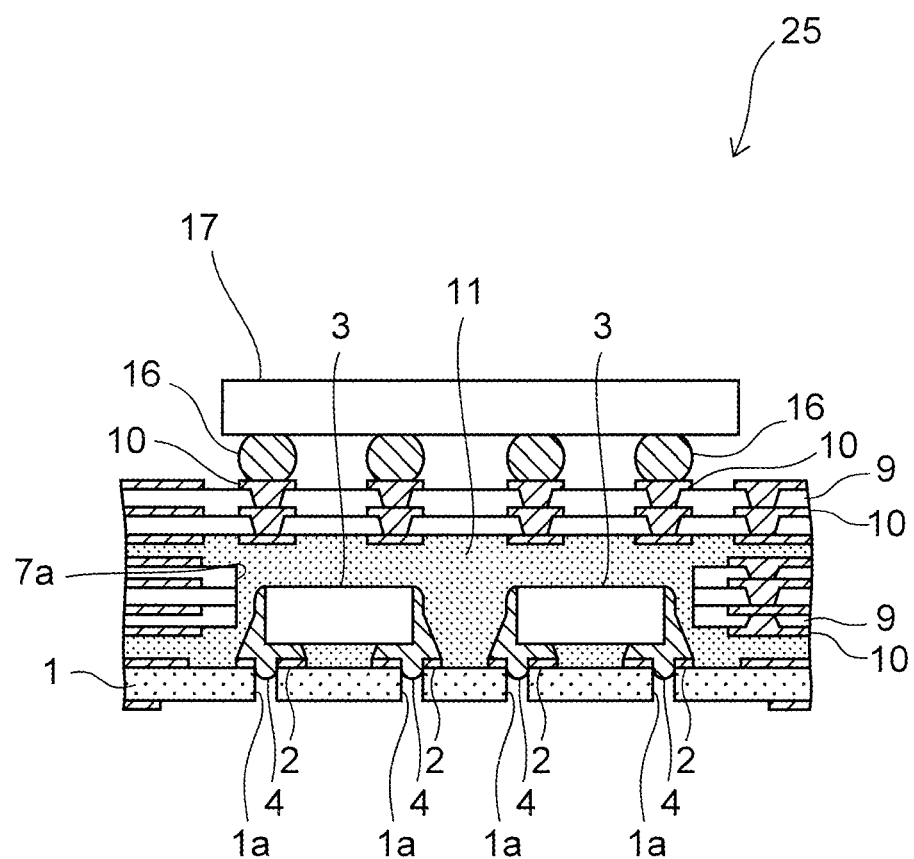

Subsequently, as illustrated in FIG. 3G, the semiconductor element 17 is mounted on the uppermost wiring 10 via the solder bump 16.

The material of the solder bump 16 is not particularly limited. However, the solder having lower melting point than that of the solder 4 is mechanically fragile, and thus the connection strength between the semiconductor element 17 and the wiring 10 would be reduced when such a solder of low melting point is used as the solder bump 16.

In order to enhance the connection strength between the semiconductor element 17 and the wiring 10, it is preferable to use the solder having the melting point equal to or higher than that of the solder 4 for the material of the solder bump 16. In view of this, Sn-3Ag-0.5Cu, which is the same material having the same melting point (about 220° C.) as that of the solder 4, is used for the material of the solder bump 16.

Then, the solder bump 16 is subjected to reflow under heating at a temperature of about 220° C. so as to connect the semiconductor element 17 to the wiring 10 with the solder bump 16.

In this reflow, solder 4 having the same melting point of that of the solder bump 16 melts, and the resin 11 around the solder 4 thermally expands. Thus, the solder 4 is subjected to the pressure generated by the resin 11 around the solder 4. In the present embodiment, however, the melted solder 4 escapes into the hole 1a, and hence the melted solder 4 does not spreads in the lateral direction. As a result, the solder flash, in which the conductive pads 2 adjacent to each other in the lateral direction are electrically short-circuited via the solder 4, can be suppressed.

Moreover, since the insulating base member 1, which has a low solder wettability, is exposed on the side surface of the hole 1a, the hole 1a can be prevented from being filled with the solder 4 before this process, which allows the solder to escape into the hole 1a in the process.

By these steps, the basic structure of the substrate 25 with embedded components completes.

According to the present embodiment, since the melted solder 4 can escape into the hole 1a, solder flash can be suppressed.

Although the number of the holes 1a provided in the single conductive pad 2 is one in this example, a plurality of the holes 1a may be provided in the single conductive pad 2 to increase the amount of the solder 4 escaping into the hole 1a.

Next, explanation is given for the preferable positions of the hole 1a that effectively suppress the solder flash.

Figure 5:
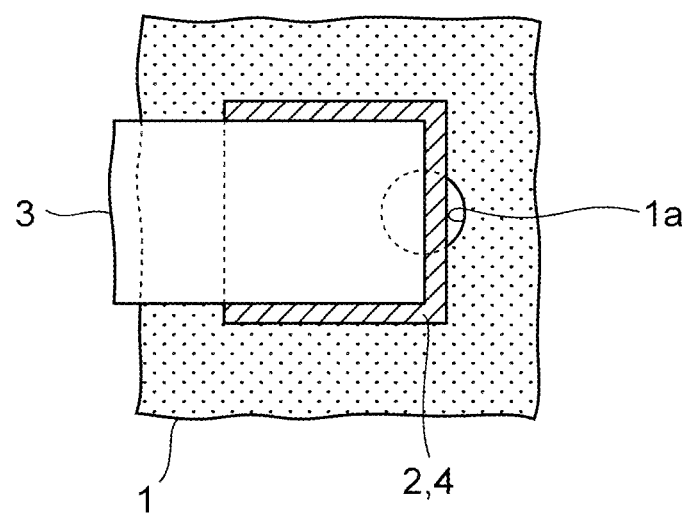
FIG. 5 is an enlarged plan view for explaining a preferable position of a hole in the first embodiment.

FIG. 5 is an enlarged plan view for explaining the preferable positions of the hole 1a, which illustrate the state immediately after the component 3 is connected to the conductive pad 2 with the solder 4 in the process illustrated in FIG. 3D.

Unlike the example in FIG. 4A, in an example illustrated in FIG. 5, a part of the hole 1a is located outside the conductive pad 2 in the plan view.

The component 3 and the solder 4 are not present at the part of the hole 1a located outside the conductive pad 2. Therefore, when the resin 11 is pressurized in the process of FIG. 3F, the resin 11 enter the part of the hole 1a that is located outside the conductive pad 2, and hence the hole 1a is closed by the resin 11. As a result, the solder 4 melted in the process illustrated in FIG. 3G cannot escape into the hole 1a, leading to an increased risk of generation of the solder flash.

On the other hand, in the present embodiment, all portions of the hole 1a is positioned inside the conductive pad 2 as illustrated in FIG. 4A. Therefore, all portions of the hole 1a is covered with the solder 4, thereby preventing the resin 11 from entering the hole 1a.

The inventor further investigated the diameter of the hole 1a which can effectively suppress the solder flash.

In this investigation, the thermal expansion amounts of the solder 4 and the resin 11 was calculated.

Figure 6:
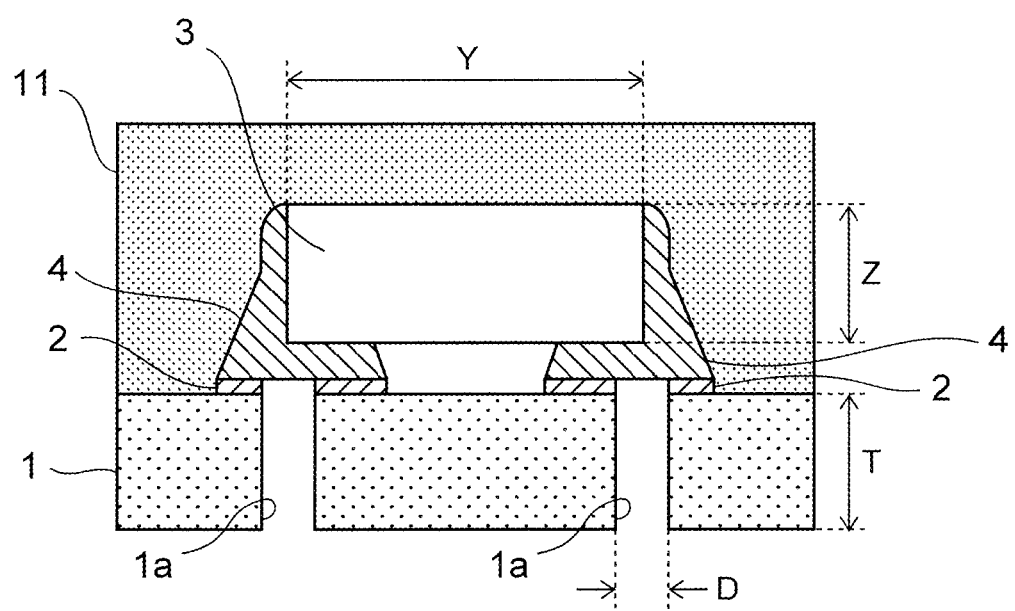
FIG. 6 is a cross-sectional view of a model used to calculate thermal expansion amounts of solder and resin in the first embodiment.

FIG. 6 is a cross-sectional view of a model used in this calculation.

In this model, the thickness of the insulating base member 1 is set as T, and the diameter of the hole 1a is set as D. Also, the height of the component 3 is set as Z, and the length of the component 3 is set as Y.

The size of the component 3 is represented by Y×Z as a combination of the length Y and the height Z. Here, four types of the dimension Y×Z were used, namely, 0.6 mm×0.3 mm, 1.0 mm×0.5 mm, 1.6 mm×0.8 mm, and 2.0 mm×1.2 mm.

FIG. 7 is a table obtained by calculating (1) the thermal expansion amount $\Delta V_s$ of the solder 4 and (2) the thermal expansion amount $\Delta V_r$ of the resin 11, for each of the electronic components 3 having these sizes. Note that each thermal expansion amount was calculated when the temperature was risen from 20° C. to 225° C. This is substantially equals to the thermal expansion amount when the temperature of each of the solder 4 and the resin 11 is risen from room temperature (20° C.) to a temperature (about 220° C.) in the reflow of FIG. 3G.

Here, the thermal expansion rate of the solder 4 was set 21 ppm/° C., and the thermal expansion amount of the resin 11 was set 60 ppm/° C.

Then, the sum ($\Delta V_s + \Delta V_r$) of (1) the thermal expansion amount $\Delta V_s$ of the solder 4 and (2) the thermal expansion amount $\Delta V_r$ of the resin 11 is equal to (3) the amount $\Delta V_h$ of the solder 4 entering the hole 1a.

Note that, for reference, FIG. 7 also lists the area $S_c$ of the conductive pad 2 in the plan view which is suitable for each size of the electronic component 3.

On the other hand, FIG. 8 is a table obtained by calculating the diameter D of the hole 1a which is suitable for each of the aforementioned sizes of the electronic component 3, the area Sh of the hole 1a in the plan view, and the volume V of the hole 1a. In this calculation, the thickness T of the insulating base member 1 was set to 0.06 mm, which is a smallest thickness for practical use.

Here, when the volume V of the hole 1a is smaller than the amount $\Delta V_h$ (see FIG. 7), the all of the hole 1a is filled with the solder 4, which makes it difficult to absorb the thermal expansion of the solder 4 by the hole 1a. This problem becomes significant, when the hole 1a on a side opposite to the component 3 is closed.

In order to prevent this problem, the volume V of the hole 1a is preferably set to be equal to or larger than the amount $\Delta V_h$ ($\Delta V_h \leq V$) to prevent the hole 1a from being fully filled with the solder 4.

According to FIGS. 7 and 8, $\Delta V_h \leq V$ holds when the diameter D of the hole 1a is equal to or larger than 0.07 mm. Thus, by setting the diameter D to be equal to or larger than 0.07 mm, the hole 1a is prevented from being fully filled with the solder 4. This is equivalent to setting the area Sh of the hole 1a to be equal to or larger than 4% of the area $S_c$ of the conductive pad 2.

In contrast, when the diameter D is too large, the area of the portion of the conductive pad 2 which is connected to the solder 4 becomes small, which results in a reduction in the connection strength between the conductive pad 2 and the component 3. In order to prevent this reduction in the connection strength, the diameter D is preferably set to be equal to or smaller than 0.3 mm. As for an area ratio of the hole 1a and the conductive pad 2, such a reduction in the connection strength can be prevented by setting the area Sh of the hole 1a to be equal to or smaller than 20% of the area $S_c$ of the conductive pad 2.

Second Embodiment

In the present embodiment, wiring is densely formed in a substrate with embedded component as described below.

Figure 9A:
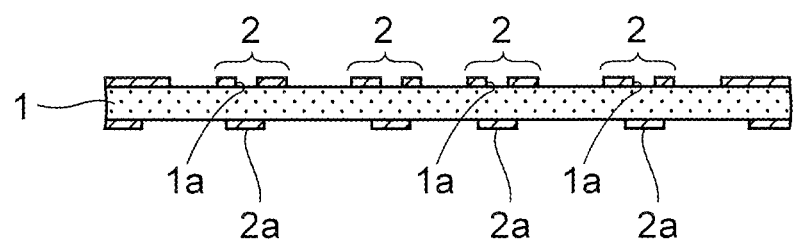
FIGS. 9A to 9E are cross-sectional views of a substrate with embedded component in the course of manufacturing thereof according to a second embodiment.

FIGS. 9A to 9E are cross-sectional views of the substrate with embedded component in the course of manufacturing thereof according to the present embodiment. In FIGS. 9A. to 9E, the same element as that described in the first embodiment is denoted by the same reference numeral as that in the first embodiment, and description thereof is omitted in the following.

First, as illustrated in FIG. 9A, a copper-clad base member, which is made by forming copper films on both surfaces of the insulating base member 1, is prepared. Then, the copper film on one of the surfaces of the insulating base member 1 is patterned into conductive pads 2, and the copper film on the other surface of the insulating base member 1 is patterned into conductive patterns 2a.

In the present embodiment, the hole 1a is formed in the conductive pad 2 at this patterning.

Figure 9B:
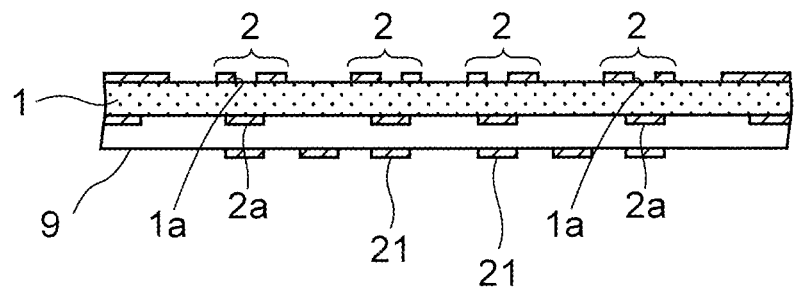

Subsequently, as illustrated in FIG. 9B, a resin sheet as the insulating layer 9 is adhered onto the other surface of the insulating base member 1, and then a copper-plated film is formed on this insulating layer 9 and is patterned to form wiring 21 having a thickness of about 12 μm to 35 μm.

As the insulating layer 9, a resin sheet of epoxy resin having a thickness of about 0.06 mm to 0.2 mm can be used, for example.

Figure 9C:
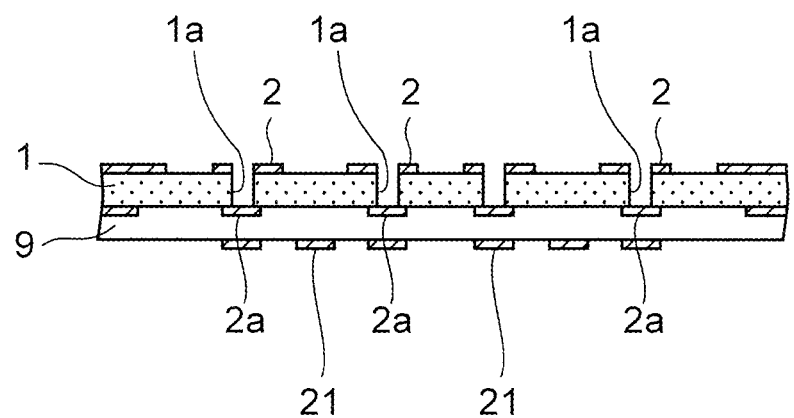

Then, as illustrated in FIG. 9C, the hole 1a is formed in the insulating base member 1 by irradiating the insulating base member 1 with excimer laser and the like through the hole 1a of the conductive pad 2.

The power of the laser is set enough to evaporate the insulating base member 1 made of resin, and is insufficient to evaporate the conductive pattern 2a. Thus, the conductive pattern 2a is not opened in this process, and hence the structure in which the hole 1a is closed by the conductive pattern 2a is obtained.

Figure 9D:
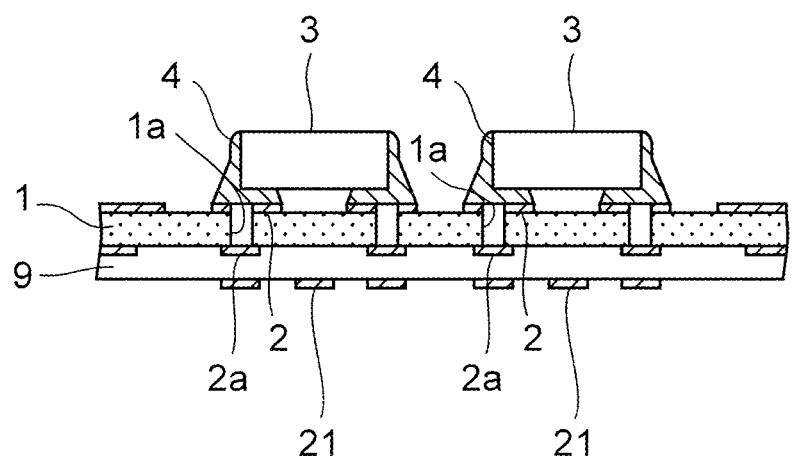

Subsequently, as illustrated in FIG. 9D, the component 3 is connected to the conductive pad 2 with the solder 4, similarly to the first embodiment.

Figure 9E:
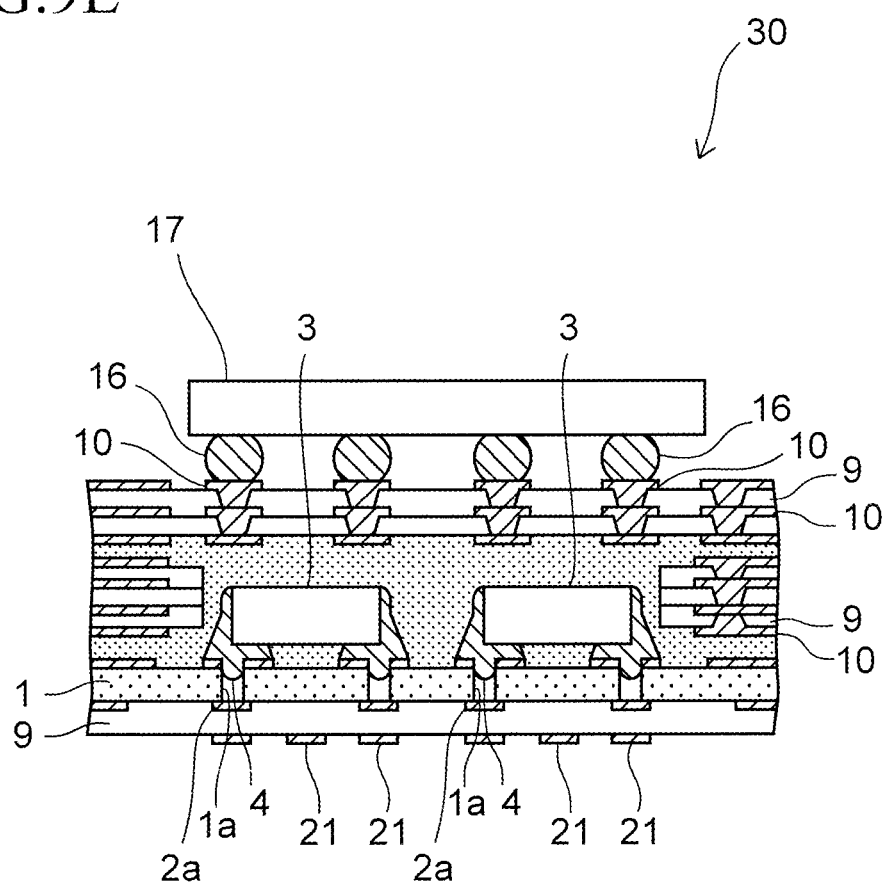

Thereafter, the processes illustrated in FIGS. 3E to 3G in the first embodiment are performed, thereby obtaining the basic structure of a substrate 30 with embedded component according to the present embodiment illustrated in FIG. 9E.

According to the present embodiment described above, the conductive pattern 2a closes the hole 1a as illustrated in FIG. 9C. When the hole 1a is formed in the insulating layer 9 below the conductive pattern 2a, the hole 1a would be an obstacle to route the wiring 21 on the insulating layer 9.

However, by closing the hole 1a in this manner, the wiring 21 can be flexibly routed, and hence the wiring 21 can be formed at high density.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A substrate with embedded component comprising:
   an insulating base member;
   a conductive pad formed on the insulating base member;
   a component connected to the conductive pad with a solder; and
   a resin covering the component, wherein
   a hole is provided in the insulating base member and the conductive pad, and
   the insulating base member is exposed on a side surface of the hole.

2. The substrate with embedded component according to claim 1, further comprising:
   a conductive pattern formed below the insulating base member, wherein the conductive pattern closes the hole.

3. The substrate with embedded component according to claim 2, further comprising:
   an insulating layer formed on each of the insulating base member and the conductive pattern; and
   a wiring formed on the insulating layer.

4. The substrate with embedded component according to claim 1,
   wherein all portions of the hole is included in the conductive pad in a plan view.

5. The substrate with embedded component according to claim 1, wherein the hole has a diameter of 0.07 mm to 0.3 mm.

6. The substrate with embedded component according to claim 1, further comprising:
   an uppermost wiring provided over the insulating base member; and
   a semiconductor element connected to the uppermost wiring with a solder bump, wherein
   the solder bump has a melting point equal to or higher than a melting point of the solder.

7. The substrate with embedded component according to claim 1, further comprising:
   a first wiring base member provided over the insulating base member and including an opening that houses the component, wherein
   the opening is filled with the resin.

8. The substrate with embedded component according to claim 7, further comprising:
   a second wiring base member provided over the first wiring base member, where the second wiring base member closing the opening.

9. The substrate with embedded component according to claim 1, wherein
   the resin is a thermosetting resin.

* * * * *